US009974134B2

(12) United States Patent
Hayashi et al.

(10) Patent No.: US 9,974,134 B2
(45) Date of Patent: *May 15, 2018

(54) LIGHT-DIMMING DEVICE

(71) Applicant: Panasonic Intellectual Property Management Co., Ltd., Osaka (JP)

(72) Inventors: Masanori Hayashi, Osaka (JP); Yoshifumi Suehiro, Osaka (JP); Kiyoshi Goto, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/300,065

(22) PCT Filed: Mar. 26, 2015

(86) PCT No.: PCT/JP2015/001710
§ 371 (c)(1),
(2) Date: Sep. 28, 2016

(87) PCT Pub. No.: WO2015/151464
PCT Pub. Date: Oct. 8, 2015

(65) Prior Publication Data
US 2017/0150568 A1    May 25, 2017

(30) Foreign Application Priority Data

Apr. 3, 2014  (JP) .................................. 2014-077193

(51) Int. Cl.
*H05B 33/08*   (2006.01)
*H02M 1/08*    (2006.01)
(Continued)

(52) U.S. Cl.
CPC .......... *H05B 33/0851* (2013.01); *H02M 1/08* (2013.01); *H02M 1/36* (2013.01);
(Continued)

(58) Field of Classification Search
CPC ............ H05B 33/0815; H05B 33/0845; H05B 39/041; H05B 39/044; H05B 33/0851;
(Continued)

(56) References Cited

U.S. PATENT DOCUMENTS 8,310,163 B2 * 11/2012 Chen .................. H05B 33/0809
                                                  315/159
8,975,785 B2 *  3/2015 Goto ...................... H02M 1/08
                                                    307/86

(Continued)

FOREIGN PATENT DOCUMENTS

JP    11-161347 A    6/1999
JP    2008-041463 A  2/2008
(Continued)

OTHER PUBLICATIONS

International Search Report for corresponding International Application No. PCT/JP2015/001710 mailed May 19, 2015.

(Continued)

*Primary Examiner* — Vibol Tan
(74) *Attorney, Agent, or Firm* — Renner, Otto, Boisselle & Sklar, LLP

(57) ABSTRACT

Light-dimming device includes: first and second terminals; switch including switching device connected between terminals; adjuster for varying conduction angle of switch; controller for controlling switch and power supply module for supplying power to controller. Controller includes zero-cross detection circuit for detecting zero-cross of AC voltage, control circuit for generating PWM signal of on-duty ratio corresponding to conduction angle from adjuster, and driver circuit for turning device on and off by PWM signal. Controller allows device to conduct and then turn off within variable period of time, from start of half cycle of AC voltage, shorter than half cycle. Circuit starts generation of pulse in PWM signal when prescribed period of time, shorter (Continued)

than variable period of time, from zero-cross of voltage elapses.

8 Claims, 2 Drawing Sheets

(51) Int. Cl.
    *H05B 39/04*     (2006.01)
    *H02M 1/36*      (2007.01)
    *H03K 17/725*    (2006.01)

(52) U.S. Cl.
    CPC ....... *H03K 17/725* (2013.01); *H05B 33/0809* (2013.01); *H05B 33/0815* (2013.01); *H05B 33/0818* (2013.01); *H05B 33/0845* (2013.01); *H05B 39/041* (2013.01)

(58) Field of Classification Search
    CPC ............ H05B 33/0809; H05B 33/0818; Y02B 20/346; Y02B 20/146; Y02B 20/348
    See application file for complete search history.

(56) References Cited

U.S. PATENT DOCUMENTS

| | | | |
|---|---|---|---|
| 9,000,680 B2* | 4/2015 | Melanson | H05B 33/0809 315/291 |
| 9,084,316 B2* | 7/2015 | Melanson | H02M 1/4225 |
| 9,113,516 B2* | 8/2015 | Bordin | H05B 33/0815 |
| 9,113,530 B2* | 8/2015 | Yagi | H05B 33/086 |
| 9,215,772 B2* | 12/2015 | Sood | H02M 7/04 |
| 9,307,588 B2* | 4/2016 | Li | H05B 33/0803 |
| 9,320,091 B2* | 4/2016 | Gaknoki | H05B 33/0815 |
| 9,473,031 B2* | 10/2016 | Mao | H02M 3/33507 |
| 9,491,845 B2* | 11/2016 | Melanson | H05B 33/0854 |
| 9,532,414 B2* | 12/2016 | Kumada | H05B 33/0815 |
| 9,615,424 B2* | 4/2017 | Ido | H05B 33/089 |
| 9,699,851 B2* | 7/2017 | Yagi | H05B 33/0845 |
| 9,801,247 B2* | 10/2017 | Hayashi | H05B 33/0851 |
| 2012/0153930 A1 | 6/2012 | Goto | |
| 2013/0187563 A1 | 7/2013 | Sasai et al. | |
| 2017/0019966 A1* | 1/2017 | Suehiro | H05B 33/0815 |
| 2017/0150569 A1* | 5/2017 | Hayashi | H05B 33/0851 |

FOREIGN PATENT DOCUMENTS

| | | | |
|---|---|---|---|
| JP | 2011-048978 A | 3/2011 | |
| JP | 2011-050149 A | 3/2011 | |
| JP | 2011-238353 A | 11/2011 | |
| JP | 2013-004350 A | 1/2013 | |
| JP | 2013-109982 A | 6/2013 | |
| JP | 2013-149498 A | 8/2013 | |
| JP | EP 3128814 A1 * | 2/2017 | ........... H05B 39/048 |
| JP | EP 3128815 A1 * | 2/2017 | ........... H05B 39/048 |
| WO | WO 2010/020855 A1 | 2/2010 | |

OTHER PUBLICATIONS

Form PCT/ISA/237 for corresponding International Application No. PCT/JP2015/001710 dated May 19, 2015.
Extended European Search Report dated Mar. 24, 2017 for corresponding European Application No. 15 77 2388.

* cited by examiner

LIGHT-DIMMING DEVICE

TECHNICAL FIELD

The invention relates to a light-dimming device configured to dim a lighting load, namely adjust the light output of the lighting load.

BACKGROUND ART

In the configuration of a related light-dimming device it has been known to adjust the light output of a lighting load (for example, see JP 2013-149498 A, hereinafter referred to as "Document 1").

The light-dimming device disclosed in Document 1 includes a pair of terminals, a control circuit, a control power supply for supplying control power to the control circuit, and a light output adjuster for adjusting a light output level of the lighting load.

The control circuit and the control power supply are connected in parallel to each other between the pair of terminals. The pair of terminals allows a series circuit of an AC power supply and the lighting load to be connected between. The lighting load includes a plurality of LED (light emitting diode) elements and a power supply circuit for lighting the LED elements. The power supply circuit includes a smoothing circuit composed of a diode and an electrolytic capacitor.

The control circuit includes a switch for phase control of an AC voltage supplied to the lighting load, a switch driver for driving the switch, and a controller for controlling the switch driver and the control power supply.

The control power supply is connected in parallel to the switch. The control power supply converts the AC voltage of the AC power supply to the control power. The control power supply includes an electrolytic capacitor charged by the control power.

The controller is supplied with the control power from the control power supply through the electrolytic capacitor. The controller includes a microcomputer. The microcomputer performs reverse phase control of interrupting power supply to the lighting load during each half cycle of the AC voltage in accordance with a light output level adjusted with the light output adjuster.

As a related light-dimming device of this sort, a two-wire anti-phase control device has been proposed (for example, see JP 2011-238353 A, hereinafter referred to as "Document 2").

The two-wire anti-phase control device disclosed in Document 2 includes a main current switching circuit, a dimming variable pulse delay circuit, and a DC power generation circuit.

The main current switching circuit includes a main current circuit and two MOSFETs connected in anti-series. The two MOSFETs are allowed to be connected in parallel to a series circuit of an AC power supply and a lighting load. The dimming variable pulse delay circuit is configured to determine discharge timing of a gate-charge of each of the MOSFETs. The DC power generation circuit is composed of an integration circuit of a resistor and a capacitor. The DC power generation circuit is configured to supply the dimming variable pulse delay circuit with a voltage across the capacitor as DC power.

The microcomputer of the controller in the light-dimming device disclosed in Document 1 performs the reverse phase control for the lighting load. In the light-dimming device, the switch conducts (turns on) from an OFF state when an absolute value of the AC voltage from the AC power supply is a value other than zero, and the electrolytic capacitor of the control power supply is charged by the control power for a certain period of time within time from the OFF state to turn-on of the switch. In the two-wire anti-phase control device disclosed in Document 2, the capacitor of the DC power generation circuit is charged over a period of time until each MOSFET is turned on from an OFF state.

However, in the light-dimming device of Document 1, when the series circuit of the AC power supply and the lighting load is connected between the pair of terminals, the lighting load is provided with the smoothing circuit and therefore the electrolytic capacitor may not be charged well by the control power. Because there is a possibility that when the switch is in an OFF state, a current would not flow through the lighting load depending on a conduction angle of the switch. This may cause unstable control operation of the controller with respect to the switch driver, thereby making it difficult to maintain a lighting state of the lighting load.

SUMMARY OF INVENTION

An object of the present invention is to provide a light-dimming device capable of maintaining a lighting state of a lighting load more stably.

A light-dimming device of the present invention includes first and second terminals (1, 2), a switch (3), an adjuster (6), a controller (4) and a power supply module (5). The first and second terminals (1, 2) allow a series circuit of an AC power supply (30) and a lighting load (31) to be connected between. The switch (3) includes a normally open switching device(s) (7) connected between the first and second terminals (1, 2). The adjuster (6) is configured to vary a conduction angle of the switch (3). The controller (4) is configured to control the switch (3) and includes a zero-cross detection circuit (9), a control circuit (11) and a driver circuit (8). The zero-cross detection circuit (9) is configured to detect zero-cross of an AC voltage from the AC power supply (30) with the series circuit connected between the first and second terminals (1, 2). The control circuit (11) is configured to generate a PWM signal (S1) that defines an on-duty ratio corresponding to the conduction angle acquired from the adjuster (6). The driver circuit (8) is configured to turn the switching device(s) (7) on and off in accordance with the PWM signal (S1). The power supply module (5) is connected between first and second terminals (1, 2) and configured to supply power to the controller (4). The controller (4) is configured to control the switch (3) by allowing the switching device (3) to conduct and then turn off within a variable period of time, from a start of each half cycle of the AC voltage from the AC power supply (30), which is shorter than a corresponding half cycle. The control circuit (11) is configured to start generation of a pulse, to be contained in the PWM signal (S1), for turning the switching device(s) on when a prescribed period of time (T1) elapses, and to stop the generation of the pulse at an end of the variable period of time. The prescribed period of time (T1) is a period of time, shorter than the variable period of time, from detection of the zero-cross of the AC voltage (Va) by the zero-cross detection circuit (9).

With the light-dimming device, it is possible to maintain the lighting state of the lighting load more stably.

BRIEF DESCRIPTION OF DRAWINGS

The figures depict one or more implementations in accordance with the present teaching, by way of example only, not by way of limitations. In the figure, like reference numerals refer to the same or similar elements where.

DESCRIPTION OF EMBODIMENTS

Figure 1:
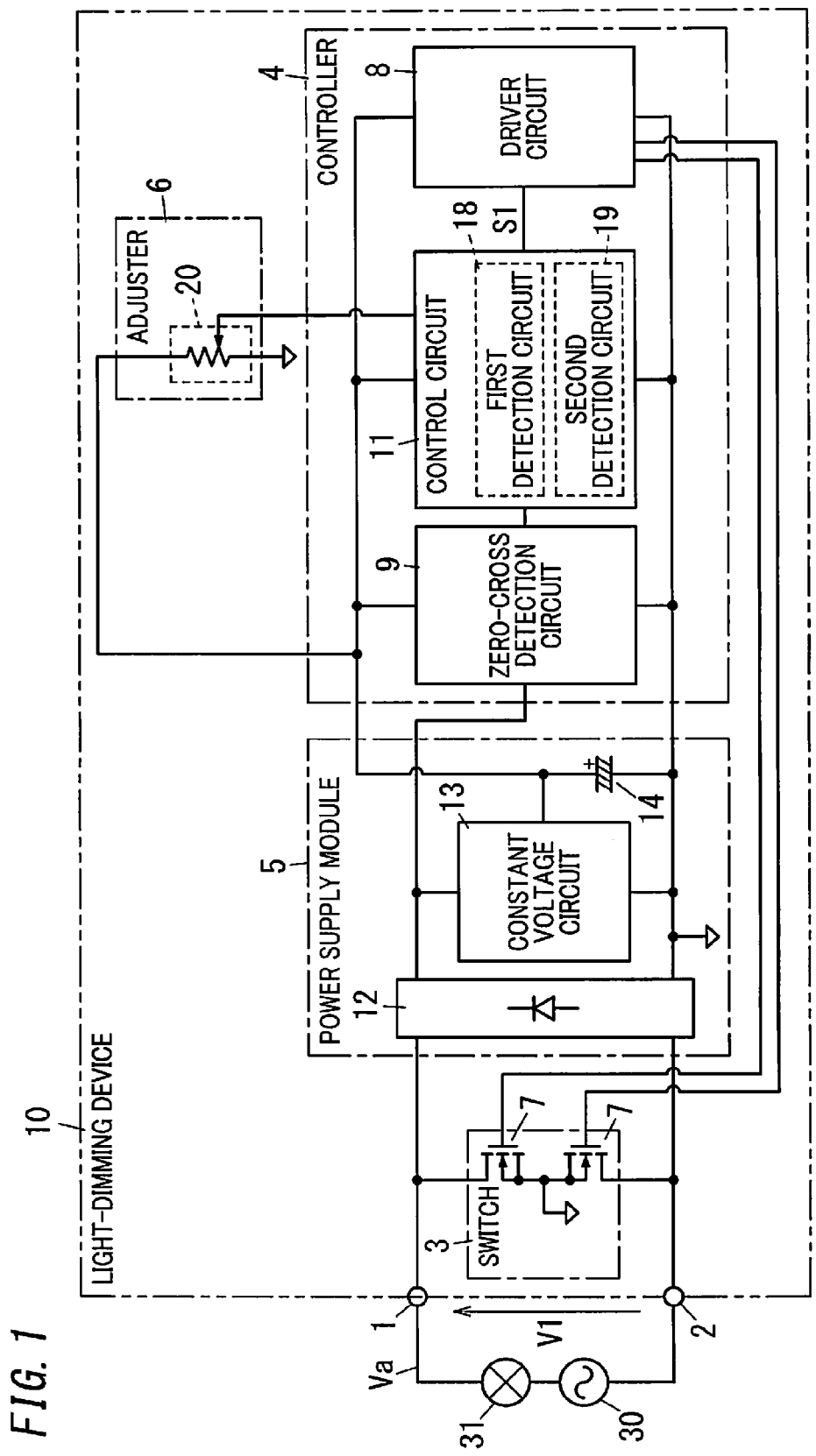
FIG. 1 is a circuit diagram of a light-dimming device according to the present embodiment.
Figure 2:
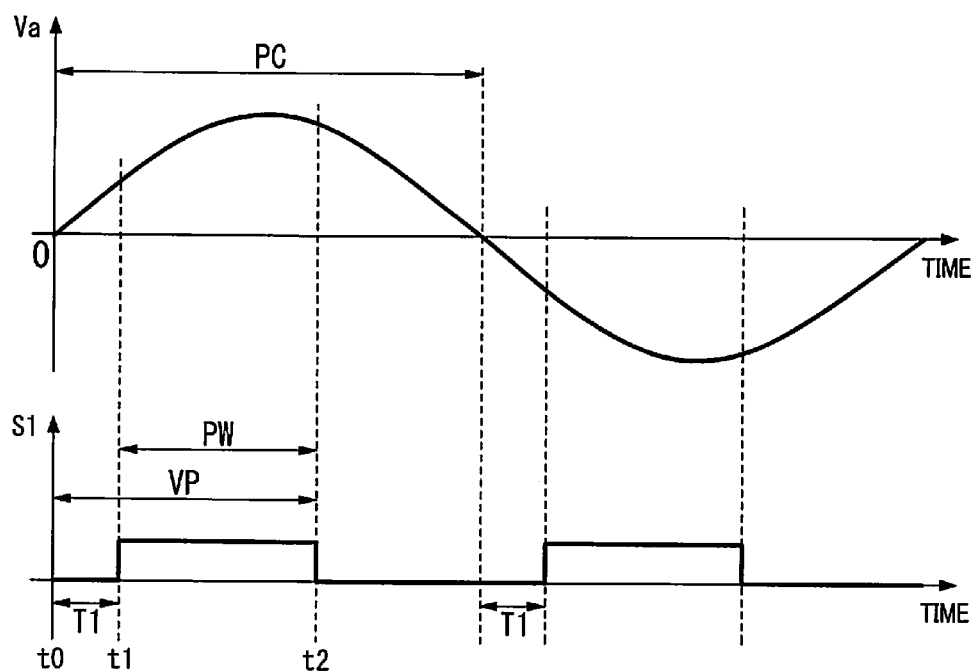
FIG. 2 is a graph illustrating a waveform of an AC voltage of an AC power supply applied to the light-dimming device of the present embodiment and a waveform of a PWM signal from a control circuit of the light-dimming device.

Hereinafter, a light-dimming device 10 according to the present embodiment is described in detail with reference to FIGS. 1 and 2.

The light-dimming device 10 is a dimmer, for example. The dimmer is configured to be attached to a mounting frame (not shown) for wall mounted accessory (wiring device).

The light-dimming device 10 includes first and second terminals 1 and 2, a switch 3 that is electrically connected between the first and second terminals 1 and 2, a controller 4 configured to control the switch 3, a power supply module 5 configured to supply power to the controller 4, and an adjuster 6 configured to vary a conduction angle (a phase angle) of the switch 3. The conduction angle of the switch 3 corresponds to a period of time while the switch 3 is conducting.

The power supply module 5 is electrically connected between the first and second terminals 1 and 2. In an example of FIG. 1, the power supply module 5 is a constant voltage source. In addition, the first and second terminals 1 and 2 allow a series circuit of an AC (alternating-current) power supply 30 and a lighting load 31 to be electrically connected between. For example, the AC power supply 30 is a commercial power supply and used for applying an AC voltage Va to the lighting load 31 through the light-dimming device 10. The lighting load 31 is an LED lighting device, for example. The LED lighting device may be an LED lamp, for example. In the embodiment, the AC power supply 30 and the lighting load 31 are not included in the light-dimming device 10 as components. In the light-dimming device 10, the LED lamp is employed as the LED lighting device, but is not limited to this. The LED lighting device may be, for example a down light, sealing light, or the like.

The switch 3 is composed of two or more (in the present embodiment, two) normally open switching devices 7. Each of the switching devices 7 is, for example an n-channel MOSFET (Metal Oxide Semiconductor Field Effect Transistor).

In the light-dimming device 10, the two switching devices 7 and 7 are connected in anti-series with source electrodes thereof connected to each other. In the light-dimming device 10, each switching device 7 is an n-channel MOSFET, but is not limited to this. For example, each switching device 7 may be an IGBT (Insulated Gate Bipolar Transistor).

The controller 4 is configured to control the switch 3 to drive the lighting load 31 in accordance with modified control of reverse phase control. The reverse phase control means controlling a current flowing through the lighting load 31 (power supply to the lighting load 31) by switching the switching devices 7 from an OFF state to an ON state when an AC voltage Va of the AC power supply 30 is zero, and by switching the switching devices 7 from the ON state to the OFF state when the AC voltage Va of the AC power supply 30 is a value other than zero. In a specific example of the reverse phase control, the switching devices 7 conduct for a variable period from a start of each half cycle of the AC voltage, wherein the variable period is shorter than each half cycle. The switching devices 7 then turn off from an end of the variable period to an end of a corresponding half cycle.

The controller 4 includes, for example a microcomputer with a program. For example, the program is stored in a memory (not shown) provided in the microcomputer in advance.

The controller 4 includes a driver circuit 8, a zero-cross detection circuit 9 and a control circuit 11. The driver circuit 8 is configured to drive the two switching devices 7 and 7. The zero-cross detection circuit 9 is configured to detect zero-cross of the AC voltage Va from the AC power supply 30. The control circuit 11 is configured to supply a PWM (Pulse Width Modulation) signal S1 to the driver circuit 8.

In short, the driver circuit 8 is configured to turn the switching devices 7 on and off in accordance with the PWM signal S1 from the control circuit 11. Accordingly, the driver circuit 8 is electrically connected to gate electrodes of the switching devices 7. The driver circuit 8 is electrically connected to the power supply module 5. The driver circuit 8 is also electrically connected to source electrodes of the switching devices 7.

The zero-cross detection circuit 9 is electrically connected to the power supply module 5. The zero-cross detection circuit 9 is also electrically connected to the control circuit 11. The zero-cross detection circuit 9 is electrically connected to the source electrodes of the switching devices 7. In short, the zero-cross detection circuit 9 is connected between both output terminals of the rectifier circuit 12, and is configured to detect zero-cross of a voltage across the output terminals, thereby detecting the zero-cross of the voltage V1 across the first and second terminals 1 and 2.

The control circuit 11 is electrically connected to each of the power supply module 5 and the adjuster 6. The control circuit 11 is also electrically connected to the driver circuit 8. The control circuit 11 is also electrically connected to the source electrodes of the switching devices 7.

In the light-dimming device 10, the controller 4 includes the microcomputer, but is not limited to this. For example, the controller 4 may include a control IC (Integrated Circuit). The controller 4 may be composed of discreet parts, for example.

The power supply module 5 includes a rectifier circuit 12, a capacitor 14 and a constant voltage circuit 13. The rectifier circuit 12 is configured to convert the AC voltage Va of the AC power supply 30 into a full-wave rectified voltage. The constant voltage circuit 13 is configured to generate a first DC (direct current) voltage from the full-wave rectified voltage from the rectifier circuit 12 and apply the first DC voltage across the capacitor 14. The capacitor 14 is an electrolytic capacitor, for example.

The rectifier circuit 12 is a diode bridge, for example. One of a pair of input terminals of the diode bridge is electrically connected to the first terminal (first input terminal) 1, while the other of them is electrically connected to the second terminal (second input terminal) 2. One of a pair of output terminals of the diode bridge (in the example FIG. 1, a positive output terminal) is electrically connected to the zero-cross detection circuit 9. The pair of output terminals of the diode bridge is electrically connected to an input part of the constant voltage circuit 13.

The constant voltage circuit 13 is a three-terminal regulator, for example. An input terminal and a common terminal of the three-terminal regulator are electrically connected to the positive output terminal and a negative output terminal of the diode bridge, respectively. A positive electrode and a negative electrode of the capacitor 14 (a positive output terminal and a negative output terminal of the power supply module 5) are electrically connected to an output terminal and the common terminal (ground terminal) of the three-terminal regulator, respectively. In the present embodiment, the ground terminal of the three-terminal regulator is electrically connected to the source electrodes of the switching devices 7. In the light-dimming device 10, the three-terminal regulator is employed as the constant voltage circuit 13, but is not limited to this. The constant voltage circuit 13 may be a DC-DC converter, for example.

The positive electrode of the capacitor 14 is electrically connected to the controller 4. That is, the controller 4 is configured to be activated by power from the power supply module 5 (a voltage across the capacitor 14). Specifically, the positive electrode of the capacitor 14 is electrically connected to each of the zero-cross detection circuit 9, the control circuit 11 and the driver circuit 8.

The positive electrode of the capacitor 14 is also electrically connected to the adjuster 6.

The adjuster 6 includes a variable resistor 20 and an operation part (not shown) attached to a volume of the variable resistor 20. The variable resistor 20 is configured to vary a resistance value thereof for generating a second DC voltage corresponding to a conduction angle of the switch 3. For example, the variable resistor 20 is a potentiometer with three terminals. The potentiometer functions as a voltage divider. In the potentiometer, two terminals (hereinafter called a first terminal and a second terminal) are connected both ends of a resistor device, respectively and a remaining terminal (hereinafter called a third terminal) is connected to a sliding contact that is mechanically movable along the resistor device.

The first terminal of the potentiometer is electrically connected to the positive output terminal of the power supply module 5 (the positive electrode of the capacitor 14). The second terminal of the potentiometer is electrically connected to the negative output terminal of the power supply module 5 (the source electrodes of the switching devices 7). The third terminal of the potentiometer is electrically connected to the control circuit 11. In the light-dimming device 10, a value of the second DC voltage (a voltage value) is set by the resistance value of the variable resistor 20. That is, in the light-dimming device 10, the size of the conduction angle of the switch 3 is adjusted by the resistance value of the variable resistor 20.

In the light-dimming device 10, the memory stores a data table (not shown) which includes values of second DC voltages and on-duty ratios for a PWM signal S1 corresponding (e.g., one by one) to the values of second DC voltages. In the example of FIG. 2, the on-duty ratio is a ratio of a pulse width (an ON-period) PW to a pulse period PC. In the present embodiment, the pulse period PC is a half cycle of the AC voltage of the AC power supply 30. However, there exists a prescribed period of time T1 as stated later, and therefore the pulse period from which it is excluded starts at an end t1 of the prescribed period of time T1 and ends at an end of a next prescribed period of time T1. A maximum value of the values of second DC voltages corresponds to a maximum value of the second DC voltage varied with the adjuster 6, and a minimum value of the values of second DC voltages corresponds to a minimum value of the second DC voltage varied with the adjuster 6. The control circuit 11 is configured to determine the on-duty ratio for the PWM signal S1 corresponding to the value of the second DC voltage by the adjuster 6 based on the data table. The control circuit 11 is also configured to supply the driver circuit 8 with the PWM signal S1 that defines the on-duty ratio corresponding to the value of the second DC voltage. In short, the control circuit 11 is configured to supply the driver circuit 8 with the PWM signal S1 that defines the on-duty ratio corresponding to the conduction angle of the switch 3 adjusted with the adjuster 6.

In the light-dimming device 10, the resistance value of the variable resistor 20 varies according to the operation of the abovementioned operation part. In other words, the size of the conduction angle of the switch 3 in the light-dimming device 10 varies according to the operation of the operation part.

In the light-dimming device 10, a rotary potentiometer is employed as the variable resistor 20, but is not limited to this. The variable resistor 20 may be, for example a linear potentiometer.

The control circuit 11 is configured to start the generation of a pulse, to be contained in the PWM signal S1 to be supplied to the driver circuit 8, for turning the switching devices 7 an 7 on when the prescribed period of time T1 elapses from detection (a point in time t0 in FIG. 2) of the zero-cross of the AC voltage Va from the AC power supply 30 through the zero-cross detection circuit 9. In the example of FIG. 2, the pulse is a rectangular pulse and the control circuit 11 is configured to raise the pulse when the prescribed period of time T1 elapses. In FIG. 2, Va of a vertical axis represents an AC voltage of the AC power supply 30. In FIG. 2, S1 of a vertical axis represents a PWM signal from the control circuit 11. In FIG. 2, each horizontal axis represents time. In FIG. 2, t1 represents a point in time when the switch 3 conducts from an OFF state. In FIG. 2, t2 represents a point in time when the switch 3 turns off from a conduction state.

The prescribed period of time T1 is equivalent to a period of time while the capacitor 14 is charged to a potential difference of the first DC voltage (a charging period of the capacitor 14). The prescribed period of time T1 is also set so as to suppress the occurrence of noise from the switch 3 (switching noise) when the switch 3 conducts from the OFF state. Specifically, the prescribed period of time T1 is set so that the switch 3 conducts from the OFF state when a small current flows through the lighting load 31.

In the light-dimming device 10, the switch 3 conducts from the OFF state when the prescribed period of time T1 elapses from the zero-cross of the AC voltage Va from the AC power supply 30. That is, in the light-dimming device 10, the switch 3 conducts from the OFF state when an absolute value of the AC voltage Va from the AC power supply 30 is a value other than zero. Thus, in the light-dimming device 10, the capacitor 14 is charged to the potential difference of the first DC voltage while the prescribed period of time T1 starts at a point in time corresponding to the zero-cross of the AC voltage Va from the AC power supply 30 and then elapses. The light-dimming device 10 can therefore stabilize the operation of the controller 4 when the switch 3 conducts from the OFF state, as compared with the light-dimming device disclosed in Document 1. As a result, the light-dimming device 10 can maintain the lighting state of the lighting load 31 more stably in comparison with the light-dimming device of Document 1. Since the light-dimming device 10 can maintain the lighting state of the lighting load 31 more stably in comparison with the light-dimming device of Document 1, it is possible to increase the number of types of lighting loads 31, capable of maintaining respective lighting states.

The control circuit 11 includes a first detection circuit 18 configured to detect (measure) the first DC voltage from the power supply module 5. Preferably, in case a value of the first DC voltage detected through the first detection circuit 18 is less than or equal to a preset first threshold, the control circuit 11 lengthens a prescribed period of time T1 than a prescribed period of time T1 in case the value of the first DC voltage is greater than the first threshold. In other words, the prescribed period of time is one of a first period of time and a second period of time for the first DC voltage, and the first period of time is longer than the second period of time. The control circuit 11 is configured to perform control based on the first period of time as the prescribed period of time T1 in case the value of the first DC voltage is less than or equal to the first threshold, and based on the second period of time as the prescribed period of time T1 in case the value of the first DC voltage is greater than the first threshold. Thus, the controller 4 can monitor the first DC voltage from the power supply module 5 and the light-dimming device 10 can more stabilize the operation of the controller 4. The first threshold may be stored in the abovementioned memory, for example.

The control circuit 11 includes a second detection circuit 19 configured to detect (measure) the second DC voltage adjusted with the variable resistor 20. Preferably, in case a value of the second DC voltage detected through the second detection circuit 19 is less than or equal to a preset second threshold, the control circuit 11 shortens a prescribed period of time T1 than a prescribed period of time T1 in case the value of the second DC voltage is greater than the second threshold. In other words, the prescribed period of time is one of a first period of time and a second period of time for the second DC voltage, and the first period of time for the second DC voltage is shorter than the second period of time for the second DC voltage. The control circuit 11 is configured to perform control based on the first period of time for the second DC voltage as the prescribed period of time T1 in case the value of the second DC voltage is less than or equal to the second threshold, and based on the second period of time for the second DC voltage as the prescribed period of time T1 in case the value of the second DC voltage is greater than the second threshold. Thus, the light-dimming device 10 can vary the prescribed period of time T1 according to the light output level of the lighting load 31. In an example, a prescribed period of time T1 in case the light output level of the lighting load 31 is low may be shortened than a prescribed period of time T1 in case the light output level of the lighting load 31 is high. The light-dimming device 10 can therefore reduce noise in case the light output level of the lighting load 31 is low in comparison with a case where the light output level of the lighting load 31 is high. The second threshold may be stored in the memory, for example.

In the light-dimming device 10, the LED lighting device is employed as the lighting load 31, but is not limited to this. The lighting load 31 may be an incandescent lamp, for example. Examples of the incandescent lamp include a tungsten halogen lamp, a krypton lamp and the like.

The light-dimming device 10 explained above includes the first and second terminals 1 and 2, the switch 3, the adjuster 6, the controller 4 and the power supply module 5. The first and second terminals 1 and 2 allow the series circuit of the AC power supply 30 and the lighting load 31 to be connected between. The switch 3 is composed of (at least a) normally open switching devices 7 connected between the first and second terminals 1 and 2. The adjuster 6 is configured to vary the conduction angle of the switch 3. The controller 4 is configured to control the switch 3, and includes the zero-cross detection circuit 9, the control circuit 11 and the driver circuit 8. The zero-cross detection circuit 9 is configured to detect zero-cross of the AC voltage Va from the AC power supply 30 with the series circuit connected between the first and second terminals 1 and 2. The control circuit 11 is configured to generate a PWM signal S1 that defines an on-duty ratio (PW/PC) corresponding to the conduction angle acquired from the adjuster 6. The driver circuit 8 is configured to turn the switching devices 7 on and off in accordance with the PWM signal S1. The power supply module 5 is connected between the first and second terminals 1 and 2, and configured to supply (electric) power to the controller 4. The controller 4 is configured to control the switch 3 by allowing the switching devices 7 to conduct and then turn off within a variable period of time VP, from a start of each half cycle (see PC in FIG. 2) of the AC voltage from the AC power supply 30, which is shorter than a corresponding half cycle. The control circuit 11 is configured to start the generation of a pulse, to be contained in the PWM signal S1, for turning the switching devices 7 on when the prescribed period of time T1 elapses, namely at a point in time t1 to stop the generation of the pulse at an end t2 of the variable period of time VP. The prescribed period of time T1 is shorter than the variable period of time VP from detection of the zero-cross of the AC voltage Va, to, by the zero-cross detection circuit 9. In the example of FIG. 2, the control circuit 11 is configured to make the pulse fall at the end t2 of the variable period of time VP. As a result, the light-dimming device 10 can stabilize the operation of the controller 4 in comparison with the light-dimming device disclosed in Document 1, and maintain the lighting state of the lighting load 31 more stably.

In an embodiment, a control circuit 11 includes a first detection circuit 18 configured to detect a voltage from a power supply module 5. A prescribed period of time T1 as stated above is one of a first period of time and a second period of time and the first period of time is longer than the second period of time. The control circuit 11 is configured to start the generation of a pulse to be contained in a PWM signal S1 when the first period of time as the prescribed period of time T1 elapses (at t1), in case a value of the voltage detected through the first detection circuit 18 is less than or equal to a preset first threshold. The control circuit 11 is also configured to start the generation of the pulse to be contained in the PWM signal S1 when the second period of time as the prescribed period of time T1 elapses (at t1), in case the value of the voltage is greater than first threshold. As a result, in this embodiment, a controller 4 can monitor a first DC voltage from the power supply module 5 and a light-dimming device 10 can more stabilize the operation of the controller 4.

In an embodiment, a power supply module 5 includes a rectifier circuit 12, a capacitor 14 and a constant voltage circuit 13. The rectifier circuit 12 is configured to convert an AC voltage Va into a full-wave rectified voltage. The constant voltage circuit 13 is configured to generate a first DC voltage from the full-wave rectified voltage by the rectifier circuit 12 to apply the first DC voltage across the capacitor 14. A first detection circuit 18 is configured to detect a voltage across the capacitor 14. As a result, in this embodiment, a controller 4 can monitor a voltage across the capacitor 14 and a light-dimming device 10 can more stabilize the operation of the controller 4.

In an embodiment, an adjuster 6 includes a variable resistor 20 configured to vary a resistance value thereof for generating a second DC voltage corresponding to a conduction angle of a switch 3. A control circuit 11 includes a second detection circuit 19 configured to detect the second DC voltage generated through the variable resistor 20. A prescribed period of time T1 as stated above is one of a first period of time and a second period of time, and the first period of time is shorter than the second period of time. The control circuit 11 is configured to start the generation of a pulse to be contained in a PWM signal S1 when the first period of time as the prescribed period of time T1 elapses (at t1), in case a value of the second DC voltage detected through the second detection circuit 19 is less than or equal to a preset second threshold. The control circuit 11 is also configured to start the generation of the pulse to be contained in the PWM signal S1 when the second period of time as the prescribed period of time T1 elapses (at t1), in case the value of the second DC voltage is greater than the second threshold. As a result, in this embodiment, a light-dimming device 10 can vary the prescribed period of time T1 according to a light output level of a lighting load 31. In an example, the light-dimming device 10 can shorten the prescribed period of time T1 in case the light output level of the lighting load 31 is low than a prescribed period of time T1 in case the light output level of the lighting load 31 is high. The light-dimming device 10 can therefore reduce noise in case the light output level of the lighting load 31 is low in comparison with a case where the light output level of the lighting load 31 is high.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A light-dimming device, comprising:
   first and second terminals that allow a series circuit of an AC power supply and a lighting load to be connected between;
   a switch that comprises a normally open switching device connected between the first and second terminals;
   an adjuster that is configured to vary a conduction angle of the switch;
   a controller that is configured to control the switch and that comprises
      a zero-cross detection circuit that is configured to detect zero-cross of an AC voltage from the AC power supply with the series circuit connected between the first and second terminals,
      a control circuit that is configured to generate a PWM signal that defines an on-duty ratio corresponding to the conduction angle acquired from the adjuster, and
      a driver circuit that is configured to turn the switching device on and off in accordance with the PWM signal; and
   a power supply module that is connected between first and second terminals and configured to supply power to the controller, wherein
   the controller is configured to control the switch by allowing the switching device to conduct and then turn off within a variable period of time, from a start of each half cycle of the AC voltage from the AC power supply, which is shorter than a corresponding half cycle, and
   the control circuit is configured to start generation of a pulse, to be contained in the PWM signal, for turning the switching device on when a prescribed period of time elapses, and to stop the generation of the pulse at an end of the variable period of time, the prescribed period of time being a period of time, shorter than the variable period of time, from detection of the zero-cross of the AC voltage by the zero-cross detection circuit.

2. The light-dimming device of claim 1, wherein:
   the control circuit comprises a first detection circuit that is configured to detect a voltage from the power supply module;
   the prescribed period of time is one of a first period of time and a second period of time, and the first period of time is longer than the second period of time; and
   the control circuit is configured
      to start the generation of the pulse to be contained in the PWM signal when the first period of time as the prescribed period of time elapses, in case a value of the voltage detected with the first detection circuit is less than or equal to a preset first threshold, and
      to stop the generation of the pulse to be contained in the PWM signal when the second period of time as the prescribed period of time elapses, in case the value of the voltage is greater than the first threshold.

3. The light-dimming device of claim 2, wherein the power supply module comprises:
   a rectifier circuit that is configured to convert the AC voltage into a full-wave rectified voltage;
   a capacitor; and
   a constant voltage circuit that is configured to generate a first DC voltage from the full-wave rectified voltage by the rectifier circuit to apply the first DC voltage across the capacitor, wherein
   the first detection circuit is configured to detect a voltage across the capacitor.

4. The light-dimming device of claim 1, wherein:
   the adjuster comprises a variable resistor that is configured to vary a resistance value thereof for generating a second DC voltage corresponding to the conduction angle of the switch;
   the prescribed period of time is one of a first period of time and a second period of time, and the first period of time is shorter than the second period of time; and
   the control circuit comprises a second detection circuit that is configured to detect the second DC voltage generated through the variable resistor,
   the control circuit being configured
      to start the generation of the pulse to be contained in the PWM signal when the first period of time as the prescribed period of time elapses, in case a value of the second DC voltage detected with the second detection circuit is less than or equal to a preset second threshold, and
      to start the generation of the pulse to be contained in the PWM signal when the second period of time as the prescribed period of time elapses, in case the value of the second DC voltage is greater than the second threshold.

5. A light-dimming device, comprising:
   first and second terminals;
   a switch connected between the first and second terminals;
   an adjuster configured to adjust a conduction angle of the switch;
   a controller configured to control the switch; and
   a power supply module connected between first and second terminals and configured to supply power to the controller, wherein the controller is configured to, within each half cycle of an AC voltage,
      keep the switch off until a prescribed period of time elapses from zero-cross of the AC voltage, turn on the switch when the prescribed period of time elapses, and turn off the switch when a period of time corresponding to the conduction angle adjusted by the adjuster elapses from turning on the switch.

6. The light-dimming device of claim 5, wherein:
the controller is configured to lengthen the prescribed period of time, in case a value of the power supplied from the power supply module to the controller is less than or equal to a preset first threshold.

7. The light-dimming device of claim 5, wherein:
the controller is configured to shorten the prescribed period of time, in case the conduction angle is less than or equal to a preset second threshold.

8. A light-dimming device, comprising:
a switching device connected to an AC power supply in series to a load and configured to phase-control an AC voltage supplied to the load;
a zero-cross detection circuit configured to detect a phase of the AC voltage of the AC power supply;
a power supply module connected to the switching device in parallel and configured to perform a converting action of converting the AC power supply into predetermined control power and include a capacitive element that accumulates the control power;
a controller configured to receive supply of the control power from the power supply module through the capacitive element,
divide, on a basis of the phase detected by the zero-cross detection circuit, a period of each half cycle of the AC voltage into a first section, a second section, and a third section,
in the first section, subject the switching device to non-conduction control to interrupt power supply to the load and subject the power supply module to perform the converting action;
in the second section, subject the switching device to conduction control to supply electric power to the load and subject the power supply module to stop performing the converting action, and
in the third section, subject the switching device to the non-conduction control to interrupt the power supply to the load.

* * * * *